United States Patent [19]

Hathaway et al.

[11] Patent Number: 5,737,580
[45] Date of Patent: Apr. 7, 1998

[54] WIRING DESIGN TOOL IMPROVEMENT FOR AVOIDING ELECTROMIGRATION BY DETERMINING OPTIMAL WIRE WIDTHS

[75] Inventors: David James Hathaway, Underhill Ctr.; Douglas Wayne Kemerer, Essex Junction; William John Livingstone, Cambridge; Daniel Joseph Mainiero, Williston; Joseph Leonard Metz, South Burlington; Jeannie Therese Harrigan Panner, Underhill, all of Vt.

[73] Assignee: International Business Machines Corporation, Armonk, N.Y.

[21] Appl. No.: 430,670

[22] Filed: Apr. 28, 1995

[51] Int. Cl.⁶ .................................. H02B 1/20
[52] U.S. Cl. .................................. 395/500; 364/490
[58] Field of Search ................. 364/488, 489, 364/490, 491, 189.03, 578; 395/500

[56] References Cited

U.S. PATENT DOCUMENTS

| | | | |
|---|---|---|---|
| H842 | 11/1990 | Ochs | 357/68 |
| 3,609,480 | 9/1971 | Gerstner | 317/235 |
| 4,166,279 | 8/1979 | Gangulee et al. | 357/71 |
| 4,713,680 | 12/1987 | Davis et al. | 357/51 |
| 4,811,237 | 3/1989 | Putatunda et al. | 364/491 |
| 4,827,428 | 5/1989 | Dunlop et al. | 364/491 |
| 5,101,261 | 3/1992 | Maeda | 357/68 |
| 5,171,701 | 12/1992 | Nagamatsu | 437/51 |
| 5,243,547 | 9/1993 | Tsai et al. | 364/578 |
| 5,280,450 | 1/1994 | Nakagome et al. | 364/189.03 |
| 5,339,253 | 8/1994 | Carrig et al. | 364/489 |
| 5,345,394 | 9/1994 | Lin et al. | 364/491 |
| 5,349,542 | 9/1994 | Brasen et al. | 364/578 |
| 5,404,310 | 4/1995 | Mitsuhashi | 364/490 |
| 5,537,328 | 7/1996 | Ito | 364/489 |

FOREIGN PATENT DOCUMENTS 5206276  8/1993  Japan .

OTHER PUBLICATIONS

IBM Technical Disclosure Bulletin, Y08-91-0160, P.S. Ho and C-K. Hu, vol. 35, No. 5, Oct. 1992, "Current Density-Line Length Design Criterion For Multi-Layered Interconnects.

Primary Examiner—Kevin J. Teska
Assistant Examiner—Dan Fiul
Attorney, Agent, or Firm—Eugene I. Shkurko

[57] ABSTRACT

A method for wiring IC chips such that electromigration criteria are met while minimizing the effect on overall chip wireability. A technique to optimize the width of automatically routed wire segments so that these widths are adequate to support the electromigration current on that net as a function of the capacitive loading of the net itself.

17 Claims, 14 Drawing Sheets

FIG.1
Prior Art

INVENTION
FIG.2

| * NBR EMERRORS | (fF) WORST EMERROR | SOURCE CKT INSTANCE NAME | NET NAME |
|---|---|---|---|
| 10 - | 2373 | PR051AM | PR051AM32 |
| 5 - | 2433 | PR069AO | PR069AO30 |
| 10 - | 2371 | PR069AP | PR069AP32 |
| 9 - | 2401 | PR022AZ | PR022AZ39 |
| 4 - | 2357 | PR069AM | PR069AM33 |
| 6 - | 2339 | PR069AN | PR069AN33 |
| 6 - | 2346 | PR069AO | PR069AO33 |
| 4 - | 2420 | PR005AZ | PR005AZ39 |
| 5 - | 2375 | PR069AM | PR069AM32 |
| 10 - | 2373 | PR069AN | PR069AN32 |
| 1 - | 42 | PR020AA | PR020AA10 |
| 1 - | 51 | PR040AA | PR040AA10 |
| 1 - | 38 | PR070AA | PR070AA10 |
| 9 - | 2457 | PR051AP | PR051AP30 |
| 1 - | 38 | PR060AA | PR060AA10 |
| 1 - | 38 | PR080AA | PR080AA10 |
| 6 - | 523 | PR050AI | PR050AI10 |
| 2 - | 460 | PR050AJ | PR050AJ10 |
| 9 - | 2470 | PR022AZ | PR022AZ33 |
| 4 - | 2307 | PR005AZ | PR005AZ34 |

| CIRCUIT PLACEMENT INFLUENCED BY EM CRITERIA |

| THE FOLLOWING ALGORITHM WOULD BE APPLIED PRIOR TO AUTOMATIC PLACEMENT |

```
FOR EACH NET ON THE DESIGN
    FIND THE SOURCE PIN FOR THE NET
    DETERMINE THE MOST "EM-RESTRICTIVE" WIRING ACCESS POSSIBLE
        TO THE SOURCE PIN (eg. INTER-PLANE CONTACT TO METAL1)
    CmaxDS = MAXIMUM DOWNSTREAM CAPACITIVE LOAD THAT CAN BE HANDLED
            BY THE WIRE ACCESS JUST DETERMINED
    OUTPUT NETNAME AND CmaxDS TO "MAX CAPACITANCE FILE" FOR USE
        BY AUTOMATIC PLACEMENT TOOL
ENDFOR
```

(2)

| AUTOMATIC ASSIGNMENT OF UNIFORM WIRE-WIDTHS TO NETS BASED ON EM CRITERIA |

| THE FOLLOWING ALGORITHM WOULD BE APPLIED PRIOR TO AUTOMATIC OR MANUAL WIRING |

```
FOR EACH NET ON THE DESIGN
    GENERATE "STEINER" WIRING FOR THE NET
    FOR EACH WIRE-WIDTH DEFINED IN TECHNOLOGY (NARROWEST TO WIDEST)
        PERFORM ELECTROMIGRATION CHECK ON ALL "STEINER" WIRE SEGMENTS
        IF (PASSED THE EM CHECK)
            THEN EXIT THIS FOR LOOP
    ENDFOR
    ASSIGN WIRE-WIDTH FROM ABOVE LOOP TO THIS NET
ENDFOR
```

FIG.6A (3)

| TAPER WIRE SEGMENTS WITHIN INDIVIDUAL NETS BASED ON EM CRITERIA |

| THE FOLLOWING ALGORITHM WOULD BE APPLIED AFTER EACH WIRING PASS FOR EACH WIRE WIDTH |

```
FOR EACH NET ON THE DESIGN
   FOR EACH WIRE SEGMENT ON THE NET
      WIDTH_TO_TRY = CURRENT_WIDTH OF THIS SEGMENT
      WHILE (NO_EM_ERROR_YET)
         PERFORM ELECTROMIGRATION CHECK USING WIDTH_TO_TRY
         IF (PASSED THE EM CHECK)
            THEN CURRENT_WIDTH = WIDTH_TO_TRY
                 WIDTH_TO_TRY = NEXT NARROWEST WIRE WIDTH DEFINED
            ELSE NO_EM_ERROR_YET = FALSE
      ENDWHILE
      SET WIDTH OF THIS SEGMENT TO CURRENT_WIDTH
   ENDFOR
ENDFOR
```

MID SEGMENT TAPER:

AFTER DETERMINING THAT THE EM LIMIT IS EXCEEDED AT THE NEAR END OF A SEGMENT AND IS NOT AT THE FAR END, FIND WHERE TO TAPER

CL = TOTAL FAR END LOAD

CE = EM CAP LIMIT FOR NEXT NARROWER WIRE WIDTH

CW = CAP /UNIT LENGTH OF NARROWER WIRE $$CL < CE < CL + LCW$$
$$\text{WANT } CE = CL + (L-X)\,CW$$
$$X = \frac{CL - CE}{CW} + L$$
$$\text{OR } X = L - \frac{(CE - CL)}{CW}$$

FIG.10

TAPERING FOR OPT. RC

CW1, RW1

$$D = RS\,(CL + X\,CW1 + (L-X)CW2) +$$
$$XRW1\,(CL + \frac{XCW1}{2} + (L-X)\,CW2) +$$
$$(L-X)\,RW2\,(CL + (L-X)\,CW2/2)$$

(ELMORE DELAY)

$$\frac{dD}{dX} = \phi \quad , \text{SOLVE FOR } X$$

SIMILAR FOR OTHER
DELAY FORMULAS

WIRING DESIGN TOOL IMPROVEMENT FOR AVOIDING ELECTROMIGRATION BY DETERMINING OPTIMAL WIRE WIDTHS

FIELD OF THE INVENTION

This invention relates to electronic design automation (EDA) tools for integrated chip (IC) wiring design. In particular, this invention provides the capability for EDA tools to effectively deal with electromigration (EM) degradation of IC circuits, thereby providing placement and wiring output that avoids IC performance and reliability problems associated with EM.

BACKGROUND OF THE INVENTION

The following definitions apply throughout the following specification. The term placement in the following specification refers to assignment of exact locations to circuits or the assignment of circuits to regions of the IC. A circuit is a an element which may be used multiple times on an IC. It is typically an element of a technology circuit library. A circuit instance is a unique instance of a circuit on an IC. Each circuit instance of a particular circuit will have a different placement and different connections to its pins (nets). A net represents a connection which must be made between sets of source and sink pins on an IC. A wire is a set of connected conductors which form the connection represented by a net. A wire segment (or segment) is a contiguous (generally straight) region of a single conducting layer of an IC which is a portion of a wire. A via is a conductor which forms a connection between different conducting layers of an IC, and which is a portion of a wire. A pin is a conducting region of a circuit instance to which a wire is connected.

IC wiring is subject to various degradation phenomena caused by electronic interaction with metal atoms, particularly at metallic grain boundaries. The rate of degradation increases with current density. If the current density can be kept below a conductor-specific threshold, degradation can be rendered negligible for the life of any particular IC circuit. EM effects become more prominent as IC frequencies increase and IC feature sizes decrease.

Prior art EM checking tools identified wired circuit errors for the circuit designer who manually input corrections to any erroneous IC circuit net, such as widening the wires in an entire net. These tools did not embody any automatic correction capability. Overdesign, i.e., overwidth, for worst case EM estimates was required which wasted valuable chip space. On the other hand, wiring nets with a minimum size wire to determine the route, and then widening the wire segments as needed may result in electrical shorts to other nets, circuits, and power buses.

No IC analysis tools took into account the capacitance of the wire segment itself in determining the width of wires that should be used, and focused only on pin capacitances and capacitance added by pre-wiring structures.

A number of factors contribute to whether an EM problem exists on an IC net. These include: the amount of current that flows through the net during switching, the switching frequency of the net, physical properties of the wire segments, operating temperature, proximity of functional circuit areas, and an anticipated lifespan of the IC.

One way to avoid the maximum current density threshold is to reduce the current passing through a wire. Another way is to increase the cross section of the wire. Yet another way to reduce current density is to minimize capacitive effects of the wiring which tend to maximize current density at an end of a wire segment nearest the current source. The capacitive effects are dependent upon the layout of the various IC components. Thus, a better designed layout can also contribute to a reduction in capacitive effects which, in turn, reduces current density.

Simple methods of addressing EM problems such as designing wider wire widths across all the IC nets result in problems such as wasted wiring space when a wide wire is used unnecessarily for an entire net. This is because the EM problem gets progressively less severe as one moves from the source pin of a net out to each of the sink pins, and wide wires are very often not needed as one moves closer to the sink pins. Also, it may be true that only a segment, or only a via, of a wiring net need be widened to eliminate EM problems for the whole net. Capacitance measurements were made but only as an intermediate final result output for a wired circuit. None of the prior art includes the capability disclosed herein to narrow wires and to analyze the results of the narrowing automatically and immediately.

The amount of current flowing through all upstream wire segments increases as the width of a given wire segment increases. This is because as a wire segment is widened its capacitance is increased, however, the rate at which current density decreases is much greater than the rate of capacitance increase. This is an important factor since increased capacitance alone will require increased driving current.

In the absence of DC loads, current drawn through a wire segment resulting from a signal transition is determined by the downstream capacitive load driven by that wire segment. The wire width that will satisfy EM requirements for a wire segment cannot be exactly determined until the route between the wire segment and all downstream sinks is determined and all downstream wire widths are known.

In general, EDA tools have automated circuit layout without automatically incorporating critical reliability criteria. Commercially available electronic design automation tools typically develop placement and wiring output in several identifiable steps. These tools take as input a list of circuit definitions. These circuits may be repeated multiple times in the circuit design. The circuit definitions, i.e., the "netlist", might include information such as a label to identify a circuit to be selected from a library of defined circuits. Each of the definitions may specify a number of connections required for the particular circuit together with other electrical constraints, a list of other circuits that need to be attached, particular data lines that must be connected, usages of other library elements, chip area blocked by the circuit, signal characteristics, size, pin locations, capacitance constraints, etc. Required connections to other defined circuits may also be specified. An amount of space occupied by a functional circuit may be specified. Chip image information may delineate where circuits can be placed, where wiring can be placed, etc. Typically, alternative constraints may be added by the user of the tool to the core definitions stored in the library.

The netlist is fed into a placement tool which outputs a general placement topology for the circuit elements. This placement topology is relayed to a wiring tool which lays down a wiring plan for the IC based on the information specified in the circuit library. The wiring may be accomplished in two steps: a global wiring pass followed by a final detailed wiring. An EM check is usually performed at this point to check for EM problems. If a problem exists, the designer typically must choose which nets to widen in order to pass the EM check. This process might require numerous iterations requiring the designer's attention at every iteration.

SUMMARY OF THE INVENTION

To improve physical properties of wire segments, the present invention selectively uses wider wiring as required. Since the RC delay of a net is also affected by wire width, performance optimization in regard to timing is an additional objective of this process. Thus, RC measurements can be used as design constraints to improve circuit timing.

The present invention addresses current density problems by employing techniques that allow EM effects to be considered by automatic circuit design tools. This is accomplished through use of capacitance targets based on EM criteria. Capacitance targets are used because the downstream capacitive load on any wire segment controls how much current will flow through it.

The present invention optimizes wiring widths and, therefore, consumed chip area, based on iteratively reducing wire widths during global and detailed wiring routines. IC circuit nets which require special handling for EM effects are identified early through a combination of automatic tools and designer input. Initial circuit placement is adjusted with consideration of EM effects. Alternatively or additionally, identified nets are wired using a uniform wire width that initially overcompensates for EM effects. Automatic tapering of these overcompensated wires is accomplished in discrete increments such that each segment of wire is the minimum discrete width satisfying EM criteria.

This inventive method requires that a set of discrete wire widths is defined for the semiconductor process to be used and pre-analyzed so that the following characteristics are known for each wire width: EM current limit, capacitance per unit length, and resistance per unit length.

It is an object of the present invention to take EM effects into account during design of ICs to prevent premature failures in the field.

It is another object of the invention to provide a method of narrowing as much as possible the wire widths of IC circuits and to use the chip area gained from this narrowing procedure.

It is yet another object of the invention to provide a method of calculating downstream net capacitances by including the capacitance of various wire based on known capacitance per unit length of the wires.

Other features and advantages of this invention will become apparent from the following detailed description of the presently preferred embodiment of the invention, taken in conjunction with the accompanying drawings.

BEST MODE FOR CARRYING OUT THE INVENTION

Overview

Figure 1:
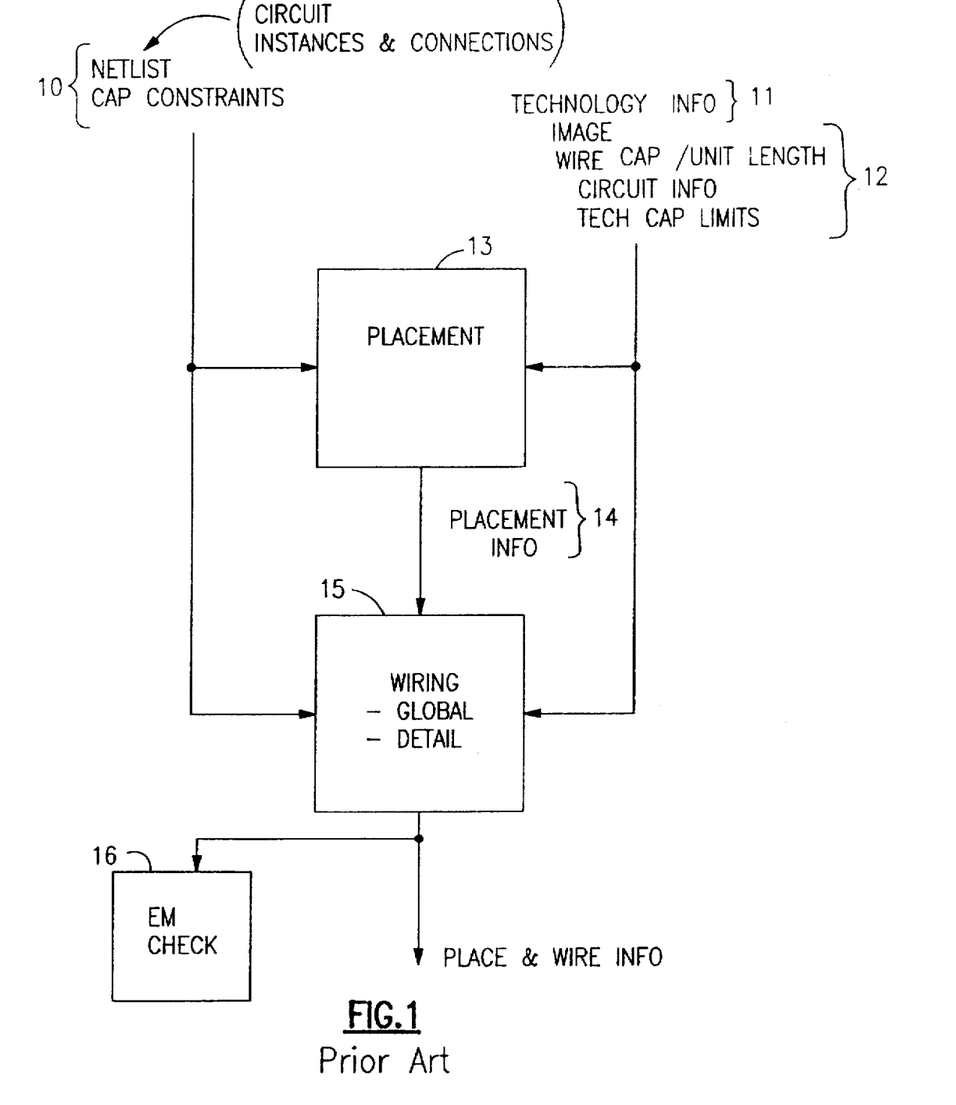
FIG. 1 illustrates a prior art automated method for IC wiring design.

In respect to FIG. 1 and from the previous discussion of the background art, it can be seen that electronic design automation tools having placement procedures which derive their input from the netlist and from circuit libraries to generate IC placements followed by relaying these placements to wiring tools having global and detailed wiring capabilities are well known in the art. Also well known is a method of estimating downstream capacitance to address possible EM problems. Thus, these tools will not be further explained in the following detailed discussion of the present invention except as necessary to understand the present inventive method.

Figure 2:
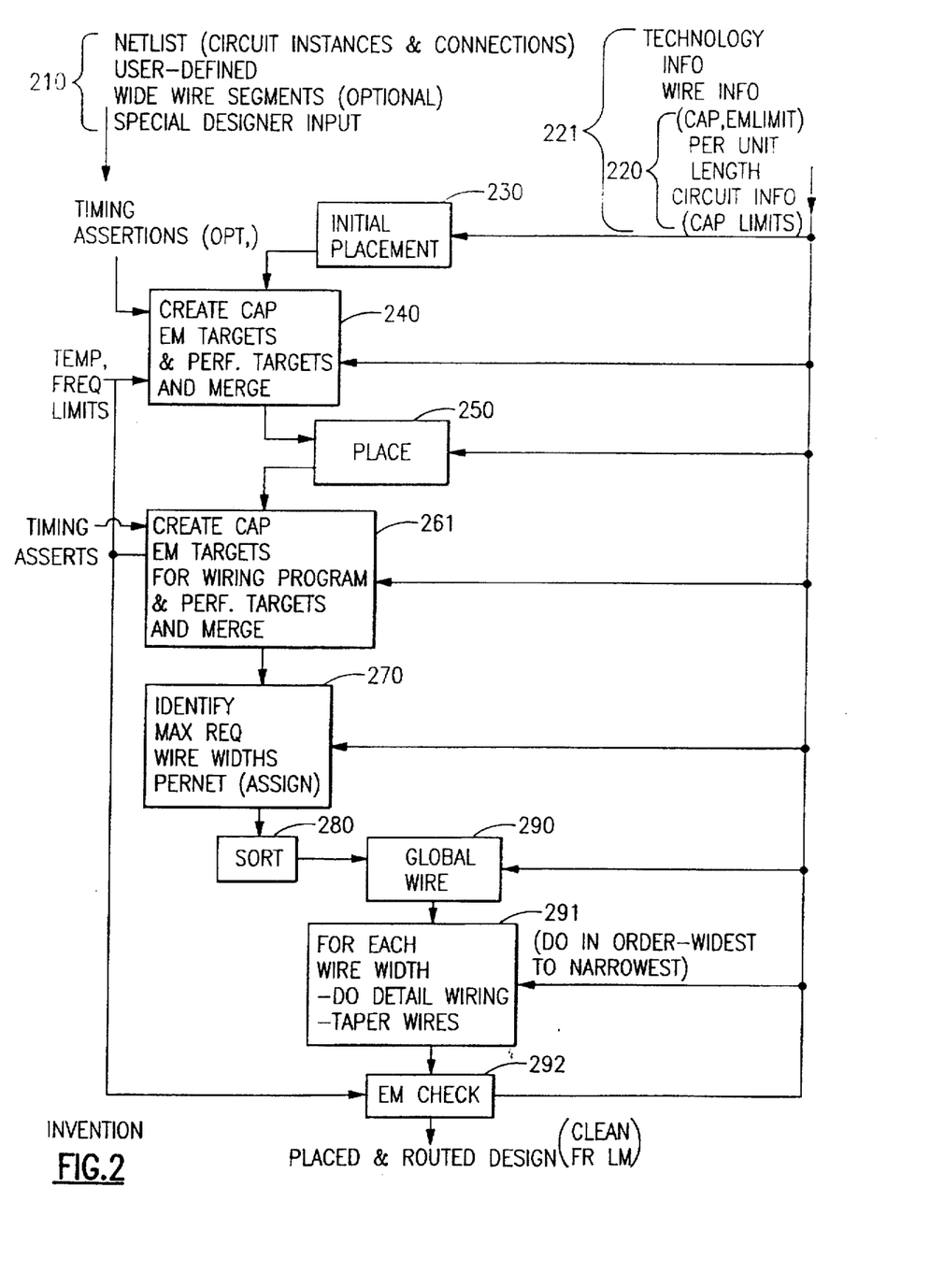
FIG. 2 illustrates the present inventive method for IC wiring.

Referring to FIG. 2, the present invention takes as input a netlist which describes the circuits to be implemented on the IC and the interconnections between them. Each item in the netlist is defined in the circuit library which is accessible by any tool in the design tool. The categories of nets that are known by the designer to require special EM treatment, if any, such as high fanout nets, are obtained. Recommended wire width data, if any, is also collected. An automatic placement tool is executed for initial circuit placement based on connectivity requirements. Estimated net configurations are developed by the tool and an EM checker performs EM checking on these estimates. It will identify potential EM problems based on the model. A capacitance target file is produced by the EM checker based on the potential EM problems, for use in a second execution of the placement tool. Other capacitance targets which affect IC timing (see Alternative Embodiments) can be merged with the EM targets in this second execution to obtain a combined effect. Such other capacitance targets include downstream RC delays that affect timing of the circuit which, if not addressed, might impose timing limits upon the circuit. Another execution of the EM checker utilizing new capacitance targets generated by the second placement tool execution at this point allows wire widths to be increased in the model until any EM errors are eliminated. The nets are then sorted into categories based on discrete wire widths. Execution of global wiring tools at this point assign general areas for each net to be routed in. Detailed routing is done on each wire width category at a time.

For each category, starting in order with the widest wire width identified, the following two steps are carried out:

(i) wire the entire category using the wire width identified for the category. This wire width is used for each wire segment for each net.

(ii) execute a taper procedure which examines each wire segment and via on each net starting at the sink pins.

The taper step determines whether the width of each wire segment can be reduced to a smaller discrete wire width based on an examination of it's EM characteristics (frequency, downstream capacitive load, predetermined EM capabilities of the wire width, etc.). The taper tool reduces width if possible, and repeats this process for each net segment and via until a minimum width is achieved that meets EM objectives. Since the EM demand on a net (capacitive load) decreases as the net fans out and gets closer to the sink pins, many wire segments closest to the sink pins can usually be reduced. In most cases, the minimum wire width is acceptable on the wire segments that connect to the sink pins. This results in an increase of available wiring space for subsequent wiring activities.

The downstream capacitances of each net element is computed based on net configuration and technology information. These elements include wire segments, vias, input and output pins, etc.

Tapering could also be done at this point in an attempt to minimize RC delay for timing critical nets. Tapering can also be generalized to allow tapering within an individual wiring segment, i.e., use multiple widths for a single segment as explained under Alternative Embodiments. After the above steps (i) and (ii) detailed routing on the minimum wire width nets can be performed using standard techniques.

EM Check

Figure 7:
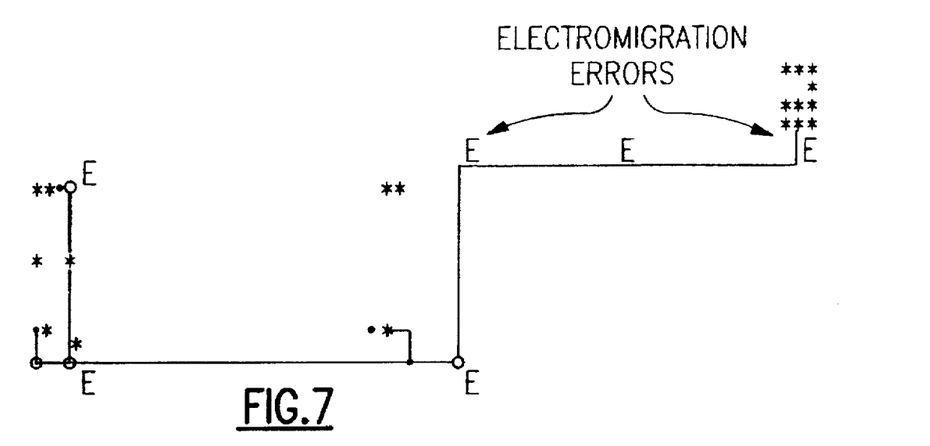
FIG. 7 shows a sample net to be modified for eliminating EM failure and showing points failing an EM check designated by "E".

The EM check can be invoked at any point for any and all nets in the IC design. It imposes the capacitance constraints, i.e., returns an error indication as shown in FIG. 7, whenever it is invoked by either the placement or wiring tool. Since the placement tool will not have wiring in place, a model estimate can be used as input to the EM checker.

This EM checking ability is needed in order to avoid EM problems. It must check each wire segment, via of a net, and source circuit of the net to insure that they are sufficient to tolerate EM effects. The following equation can be used to define a maximum downstream capacitance:

$$C_{ds} = [I_{max} \times S \times T \times L] / [2 \times F \times V]$$

where $I_{max}$ is a maximum current limit in Amps for each via/segment/source circuit; S is an AC current adjust constant based on chip technology; T is a temperature adjust constant also based on chip technology, i.e., physical properties of materials, and which will have a separate value for segments and for vias/contacts; L is a lifespan adjustment constant based on a maximum expected number of power-on hours for the chip; F is the frequency of operation in Hertz input to each net to be checked; V is the nominal chip $V_{dd}$. The known values for these variables are input from the circuit library, which is accessible by each of the tools described herein at any point.

Figure 5:
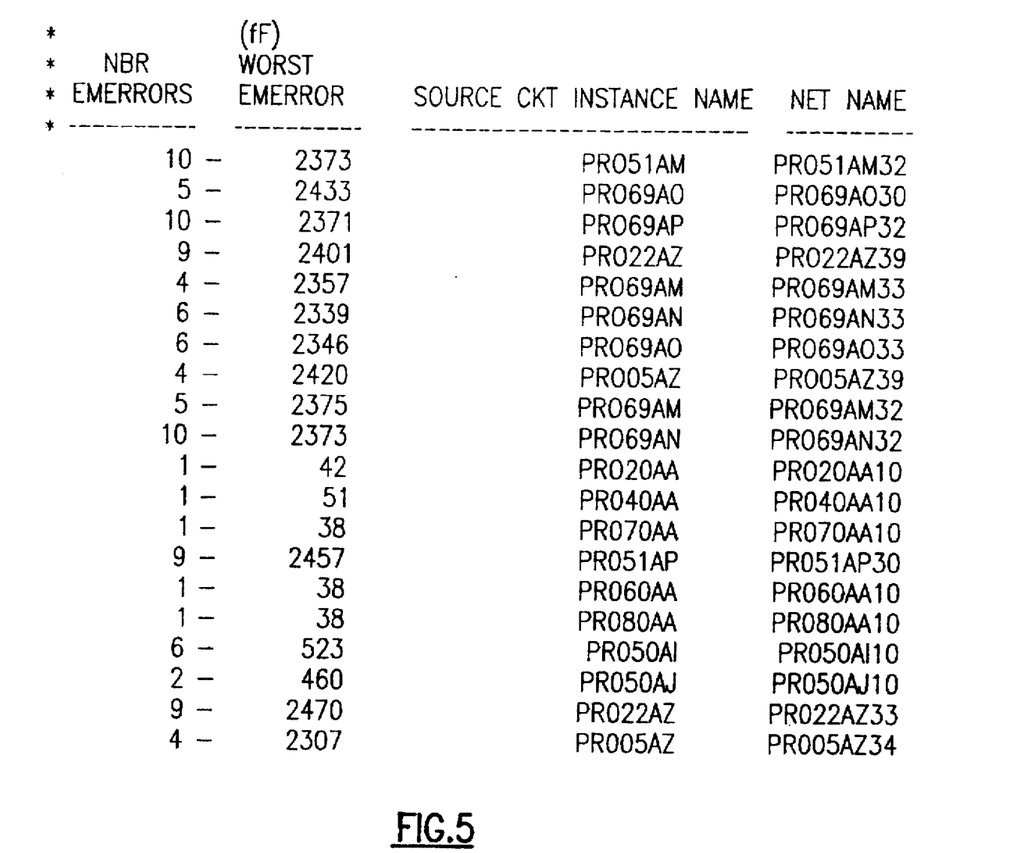
FIG. 5 is a sample output of an EM check listing failed circuits and nets.

FIG. 5 shows a sample error output of an EM checker which is used to create new capacitance targets for the second pass through the placement tool. The data shown in this Figure includes: number or errors found in each net, excess over target net capacitance, the circuit label from the circuit library, and the net name containing the circuit.

Placement Operation

Initial placement is used to estimate initial wiring routes. These estimated model wiring routes are used by the EM check to estimate EM errors. New constraints are generated to control the second iteration of the placement tool to prevent the estimated EM errors. These constraints may be merged with constraints imposed to meet performance objectives.

Procedures can consult the library when calculating, for example, a total capacitance value for a net. The present invention utilizes capacitance of the various wire widths per unit length which are stored as technology information.

Wiring

Prior to global wiring an estimated route is determined by the EM checker. After the second placement iteration, maximum required wire widths for each net are identified by testing a minimum width and incrementing the width until it passes EM check, then using that width for the entire net. Wiring tools normally do not wire using multiple wire widths for a single net, rather the tools implement a single uniform width. This uniformity can then be tapered by the tapering tool. The widest to narrowest are sorted before global wiring. Then for each width, detailed wiring and tapering will be carried out.

Global wiring produces a design for a rough assignment of wire areas, i.e., general areas without specifying exact tracks. Prior to detailed wiring the calculation of circuit characteristics is based on estimated wiring tracks. Detailed wiring assigns specific sets of wiring segments and vias that would form the connections required by the netlist.

Tapering

The unique tapering feature of the present invention simultaneously avoids possible EM failures while conserving chip space. The information required by the tapering procedure includes the capacitive load on the downstream side of a particular segment or via (including the capacitive load of the segment or via itself) as well as the technology limit allowed for the wire or via width. If the downstream load fails the EM check, no tapering is performed.

Figure 3:
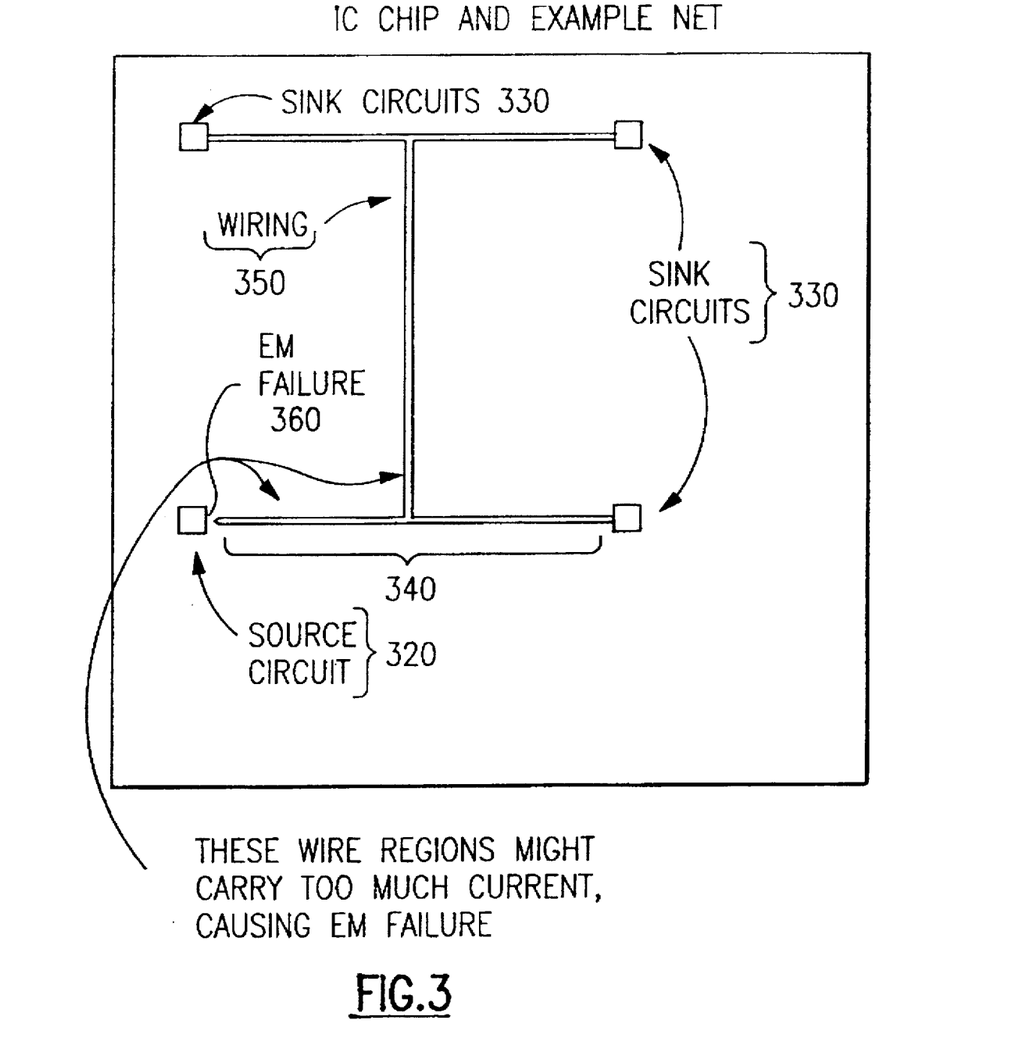
FIG. 3 illustrates an example net with an electromigration failure.
Figure 4:
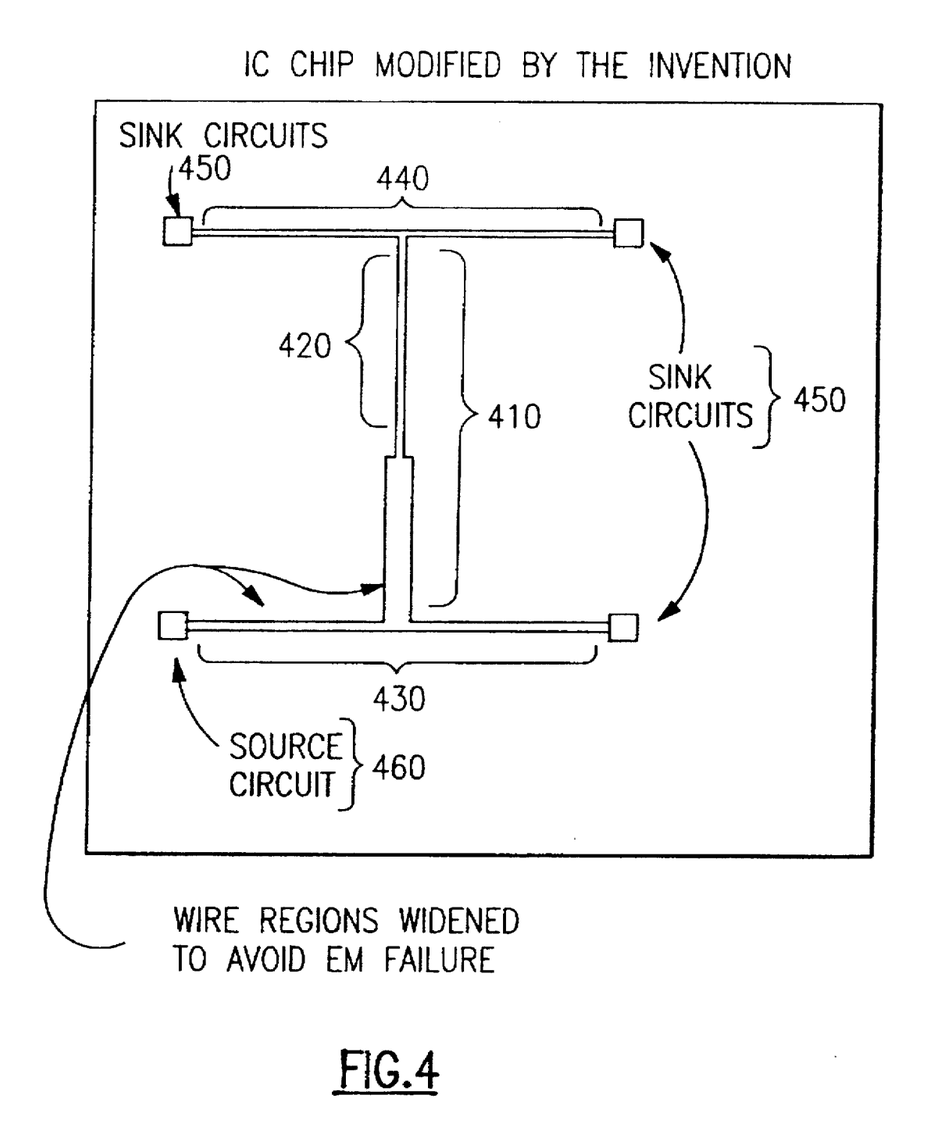
FIG. 4 illustrates the result of widening and mid-segment tapering to avoid the electromigration failure of FIG. 3 while conserving chip space.
Figure 8:
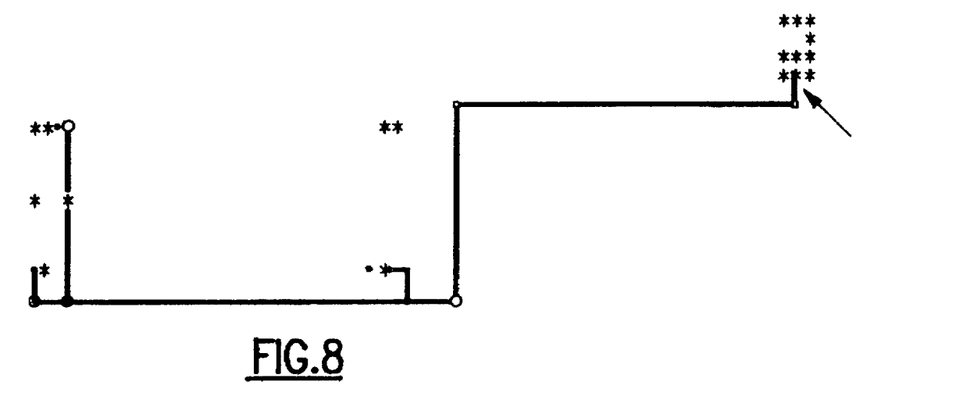
FIG. 8 shows a sample result of wire widening on the circuit of FIG. 7 resulting in no EM failures identified.
Figure 9:
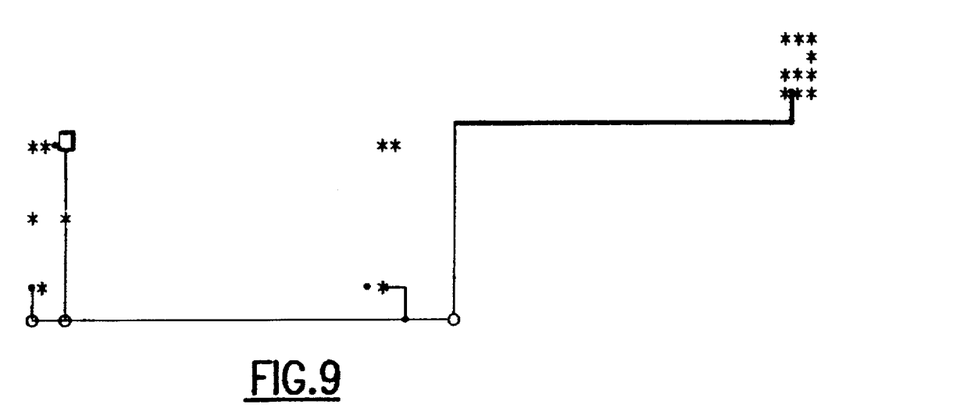
FIG. 9 shows a normal tapering (not midsegment) on all segments except for the two segments nearest the source pin and net producing no EM failures.

The taper procedure automatically downsizes net segments and vias incrementally to a minimum width that will still pass an EM check. A net is downsized starting at the sink pins then working back to the source of the net. Tapering will not introduce EM errors. Of course, a net must be fully wired before tapering can begin. The wire widths are incrementally narrowed until an EM check fails, or the minimum width is reached. The narrowest width which passed the EM check is used as the width for that segment/via. FIG. 4 illustrates a sample result of a wire segment widened to avoid a possible EM failure shown in FIG. 3. The portion 410 illustrates an alternative embodiment of the tapering procedure which tapers partial segments. Without the partial tapering feature the entire segment shown in FIG. 4 would be of uniform width as in portion 440. A net having its segments and vias widened then tapered in this manner is shown in FIGS. 8 and 9. Note that the tapering of the segments shown in FIG. 9 overcomes the EM errors indicated in FIG. 7 yet saves chip space.

Figure 6:
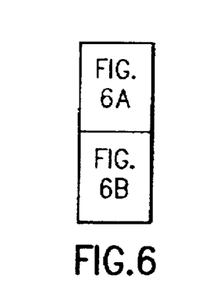
FIG. 6 lists pseudocode for several features of the present invention.
Figure 6A:
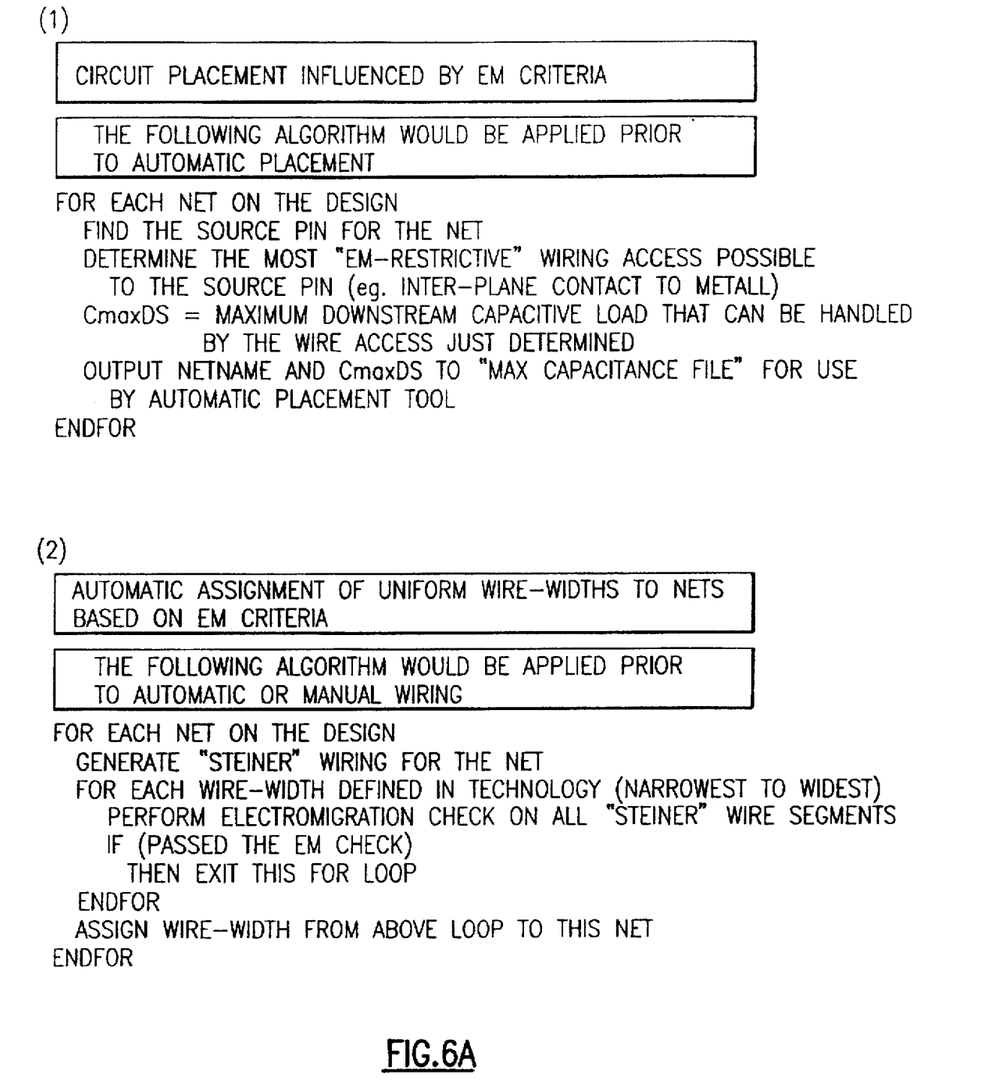
Figure 6B:
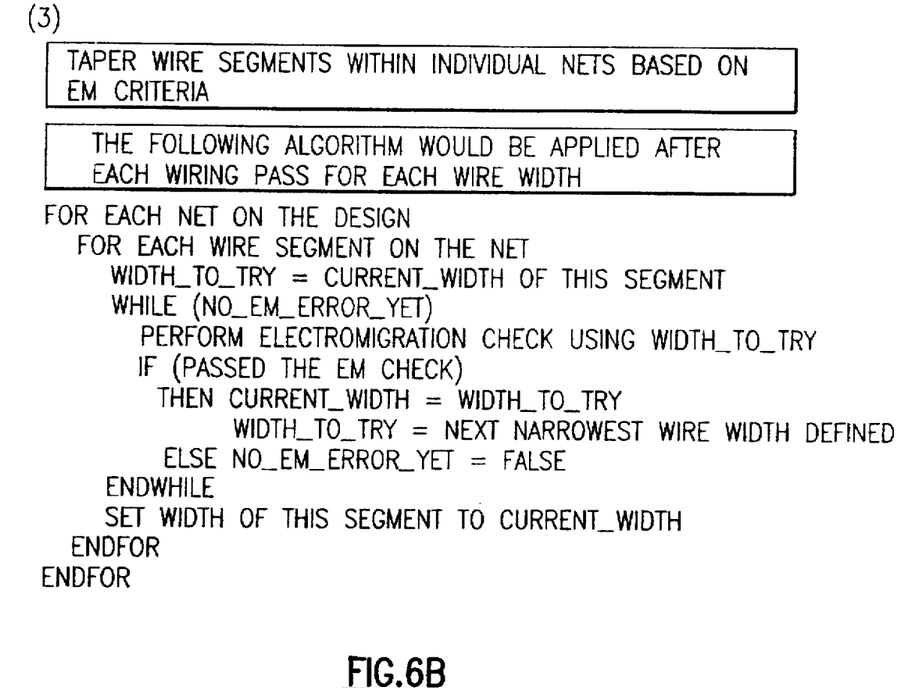

Once all nets of a given width have been tapered, the wiring procedure can take advantage of the wiring space that has been reclaimed. The next net sent into the wiring procedure can use space gained from the tapering operation. The tapering procedure can also respond to RC delay constraints used in timing critical nets. The tapering procedure is illustrated in flowchart form in FIGS. 12–15, and in pseudocode form in FIG. 6 (#3).

Advantages over the Prior Art

The advantages of the method of the preferred embodiment of this invention include: circuit placement by EDA tools is influenced by EM criteria; the tapering procedure considers the load of the wire itself in determining where and whether to taper the wire; prior to wiring each net is automatically assigned a specific uniform wire width that will satisfy its EM requirements based on initial model estimates; a feature of the present inventive tool is that the chip "real estate" gained from narrowed wiring can be used for wiring other nets.

A first complementary embodiment of this invention comprises an improvement over electronic design automation tools. Such a design tool is a well known article of commerce, such as the Cell3 product of Cadence Design Systems, Inc., and is not described further.

Alternative Embodiments

Figure 10:
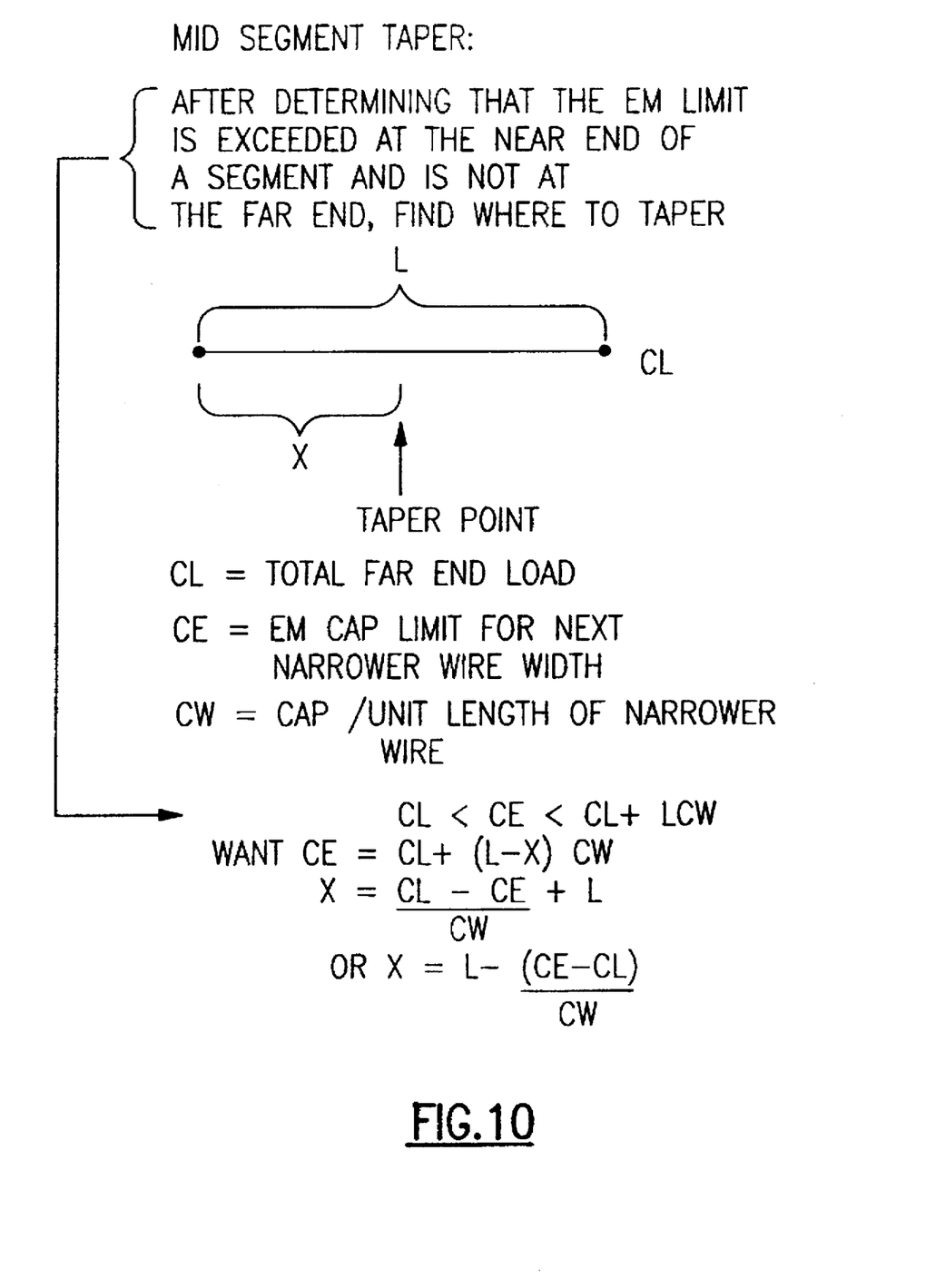
FIG. 10 shows one example of a mid-segment tapering calculation.

Referring to FIG. 10, the tapering procedure can be refined to highlight net segments wherein one end is identified by the EM checker as having failed the EM check while a downstream end of the segment passed the EM check. Normally, the tapering routine would revert to the previously identified wire width that passed the EM check. This might waste chip space if only a portion of the segment need be widened to pass the EM check. Thus, the equation shown in FIG. 10 can be implemented in the tapering procedure to identify a point in the net segment on the upstream side of which tapering will not be undertaken. An example result of this procedure is shown in FIG. 4. This simultaneously satisfies the EM check and regains valuable chip space to be used for further wiring.

Figure 11:
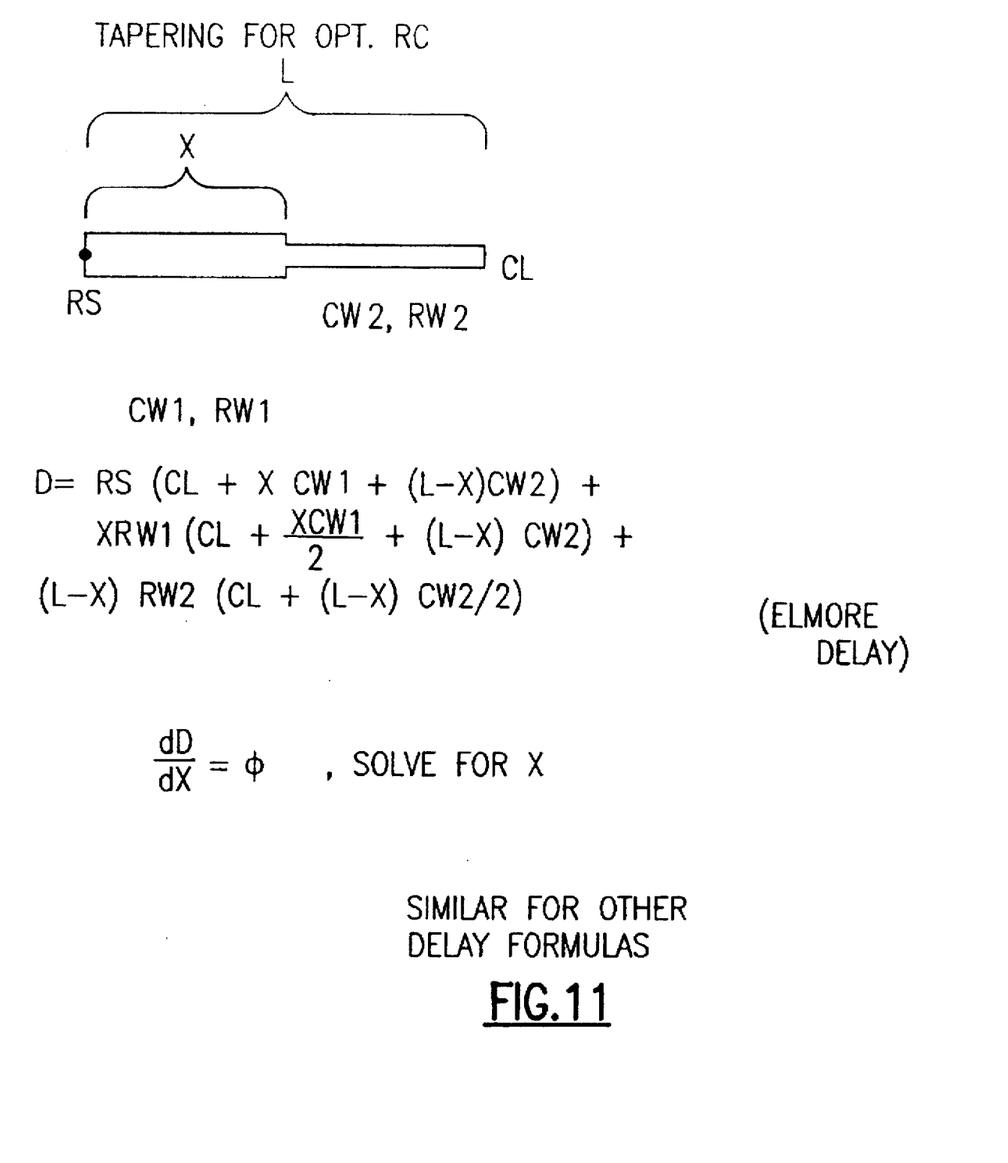
FIG. 11 shows one example of an RC timing calculation applicable for an RC checking procedure to optimize IC circuit timing performance.
Figure 12:
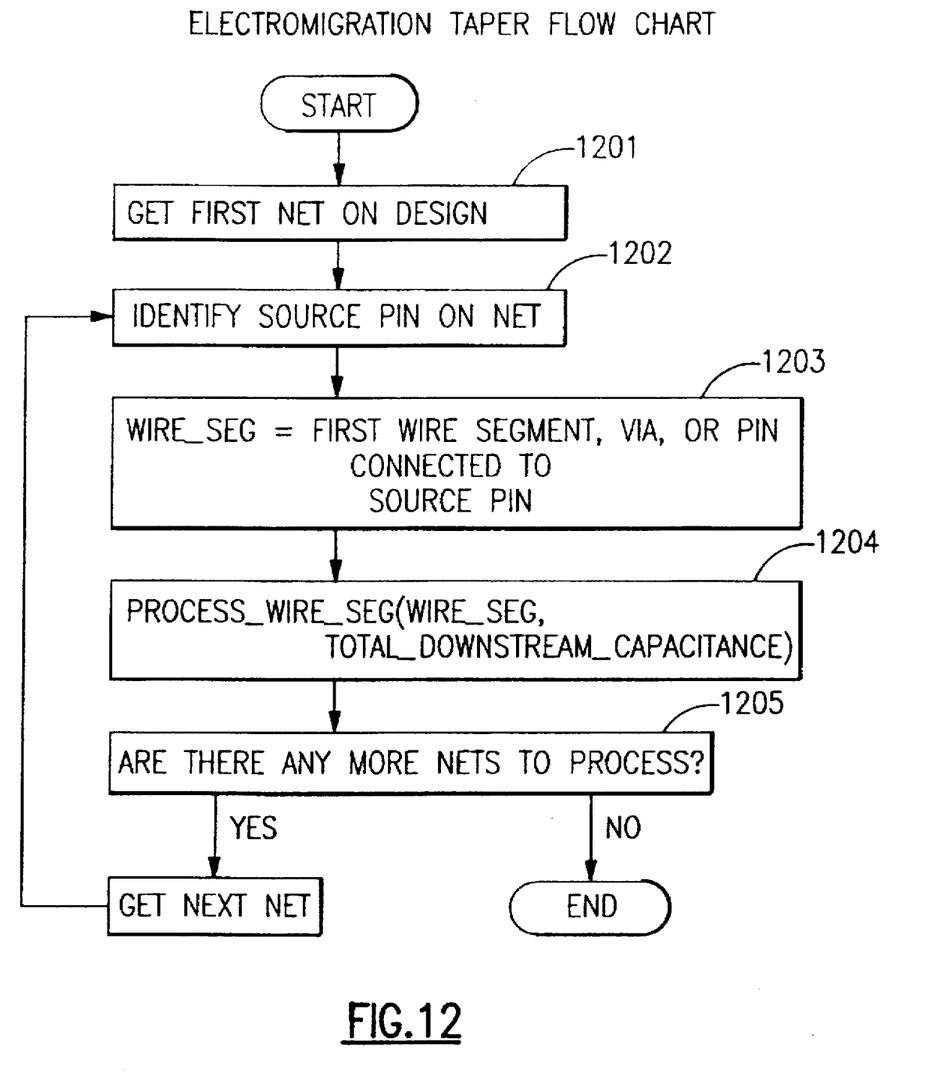
FIGS. 12–15 illustrate a flowchart for the tapering method.
Figure 13:
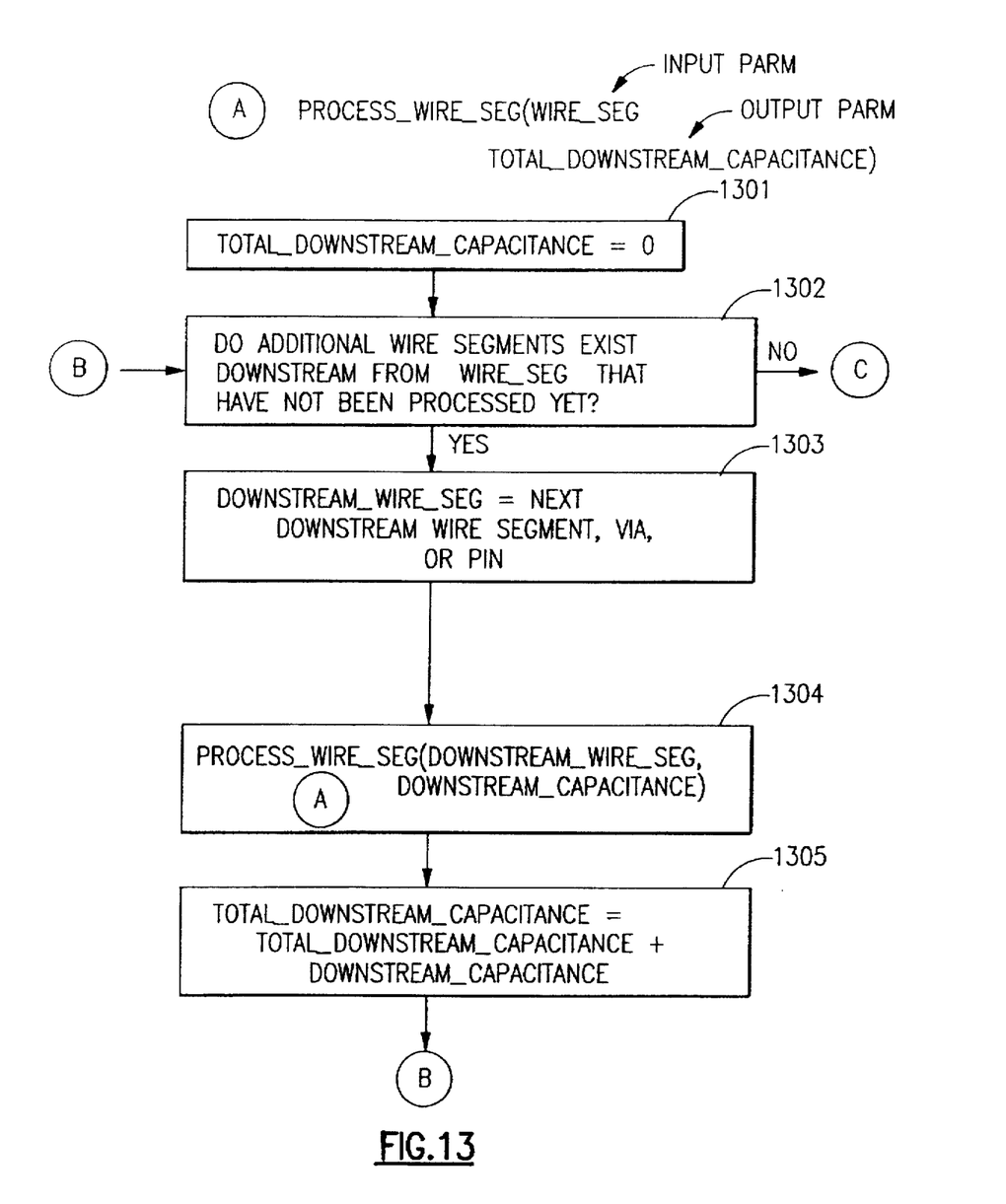
Figure 14:
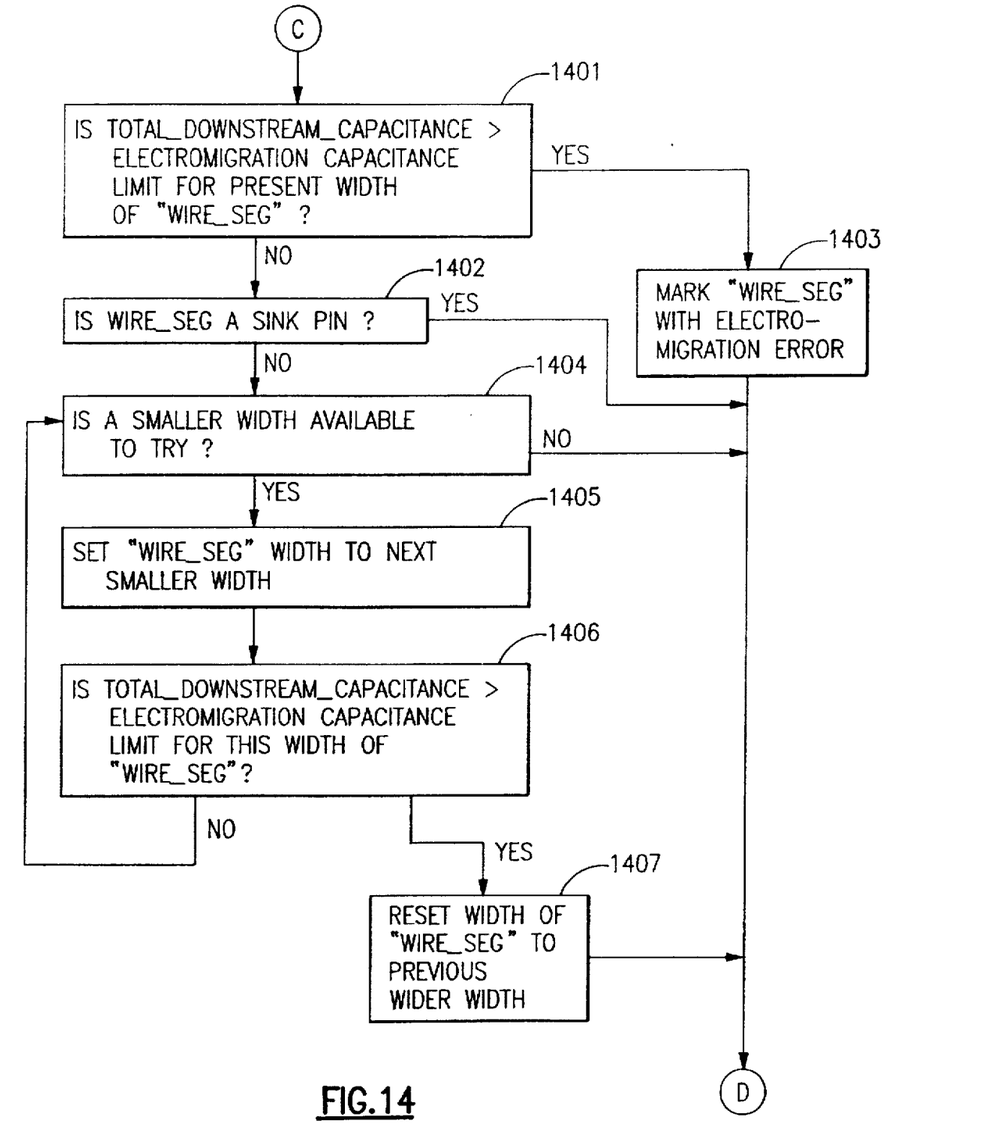
Figure 15:
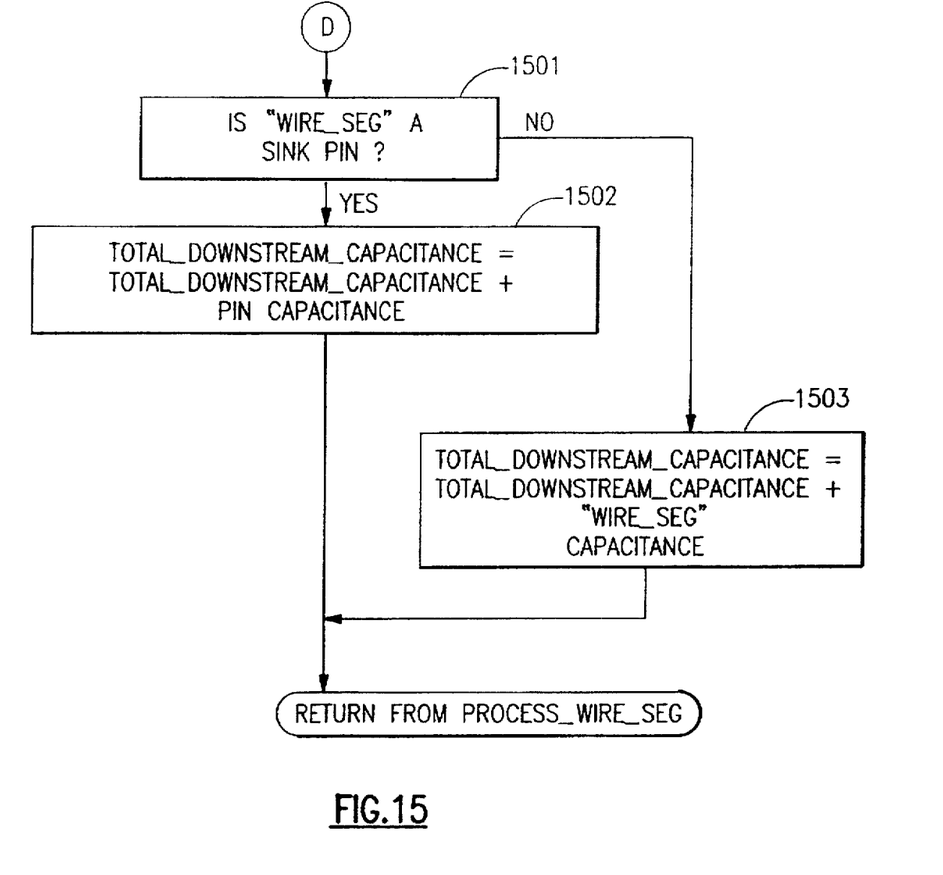

Referring to FIG. 11, a second alternative embodiment involves an RC checking scheme which optimizes an IC circuit's timing. A downstream timing delay is affected by total downstream capacitance and resistance. Ideally, resistance and capacitance should be reduced to a minimum, however, opposing effects are produced when wire width is varied. Thus, is addition to the EM check described above, IC net widths can also be tested iteratively to satisfy RC delay limits according to the equation shown in FIG. 11. Of course, a wire width recommended by the RC check must satisfy EM criteria to avoid possible wire failure. Thus, if the ideal wire width indicated by the RC check fails the EM check, the wider wire width must be utilized.

It will be appreciated that, although specific embodiments of the invention have been described herein for purposes of illustration, various modifications may be made without departing from the spirit and scope of the invention.

Accordingly, the scope of protection of this invention is limited only by the following claims and their equivalents.

We claim:

1. In an electronic design automation tool for IC circuit design having a placement procedure, a circuit library of possible circuit elements used in the IC circuit, a netlist describing the circuit elements and their interconnections, a wiring procedure for detailed wiring of the IC circuit, and an EM checker for determining downstream capacitive loading for any IC circuit segment or element, the improvement comprising:

a tapering procedure for use by the wiring procedure comprising the steps of:

(a) assigning an allowable narrower wire width to the IC segment or element;

(b) testing the narrower width with the EM checker;

(c) repeating steps (a) and (b) until the EM checker indicates an EM failure;

(d) assigning a last width tested which did not fail the EM checker test as a wire width for that segment or element;

(e) repeating steps (a) through (d) for each segment or element in an IC net.

2. The improvement according to claim 1, further comprising the step of:

(f) reducing a width of a portion of the IC segment or element including assigning an available narrower wire width to the portion, a length of the portion determined according to $$(C_E - C_L)/C_W$$

where $C_E$ is a capacitance limit of the available narrower wire width, and $C_L$ is a total far end capacitance load, and $C_W$ is a capacitance per unit length of the available narrower wire width.

3. A method for implementing an IC wiring design, comprising the steps of:

(a) providing a preliminary circuit design;

(b) locating a sink point in the preliminary circuit design including locating a wire segment terminating thereon and identifying a wire width of the wire segment;

(c) assigning an available narrower wire width to the wire segment;

(d) testing the wire segment with the assigned narrower wire width with an electromigration checker;

(e) repeating steps (c) and (d) if the wire segment with the assigned narrower wire width passes the electromigration check; and (f) finally assigning a narrowest width to the wire segment which passed the electromigration checker.

4. The method according to claim 3, further comprising the step of:

(g) tapering a width of a portion of the wire segment including assigning an available narrower wire width to the portion, a length of the portion determined according to $$(C_E - C_L)/C_W$$

where $C_E$ is a capacitance limit of the available narrower wire width, $C_L$ is a downstream capacitance lead, and $C_W$ is a capacitance per unit length of the available narrower wire width.

5. The method according to claim 3, further comprising the steps of:

(g) locating a next wire segment further from the sink point and identifying a wire width of the next wire segment;

(h) assigning an available narrower wire width to the next wire segment;

(i) testing the next wire segment with the assigned narrower wire width with the electromigration checker;

(j) repeating steps (h) and (i) if the next wire segment with the assigned narrower wire width passes the electromigration check;

(k) finally assigning a narrowest width to the next wire segment which passed the electromigration checker including storing narrowest width data in a circuit library; and (l) repeating steps (g)–(k) for each succeeding wire segment and via further from the sink point.

6. The method according to claim 3, wherein step (d) includes determining a downstream capacitive load of the wire segment and an operating frequency of the preliminary circuit design.

7. The method of claim 4, wherein the step (g) further includes the step of:

optimizing a circuit timing of the IC wiring design including determining a length of the portion according to a derivative of $$R_S(C_L + xC_{w1} + (L-w)C_{w2}) + xR_{w1}(C1 + (xC_{w1})/2 +$$
$$(L-x)C_{w2}) + (L-x)R_{w2}(C_1 + (L-x)C_{w2}/2)$$

where L is the length of the wire segment, x is a length of an untapered portion, $C_{w1}$ is a capacitance per unit length of an untapered portion, $R_{w1}$ is a resistance per unit length of the untapered portion, $C_{w2}$ is a capacitance per unit length of a tapered portion, $R_{w2}$ is a resistance per unit length of the S tapered portion, and $R_s$ is a resistance of the wire segment.

8. A method for increasing an amount of available IC area for circuit wiring, comprising the steps of:

(a) providing a netlist for a placement procedure;

(b) the placement procedure outlining a general placement topology according to the amount of available IC area for circuit wiring;

(c) selecting a net from the netlist; and (d) relaying the selected net and the placement topology to a wiring procedure for laying down a wiring plan in response to the placement topology, the wiring procedure including:

(i) selecting a wiring segment from the net;

(ii) assigning an allowable narrower wire width to the wiring segment;

(iii) testing the narrower width with an EM checker;

(iv) repeating (ii) and (iii) until the checker indicates an EM failure;

(v) assigning a last width tested which did not fail the EM checker test as a wire width for the wiring segment including increasing the amount of available IC area for circuit wiring if step (v) resulted in a narrowing of any selected wiring segment;

(vi) repeating (i) through (v) for each segment or element in the net; and (e) repeating steps (b)–(d) for each net in the netlist.

9. A program storage device readable by machine, tangibly embodying a program of instructions executable by the machine to perform method steps for minimizing IC space occupied by circuitry on said IC, said method steps comprising:

(a) receiving a preliminary circuit design;

(b) locating a sink point in the preliminary circuit design including locating a wire segment terminating thereon and identifying a wire width of the wire segment;

(c) assigning an available narrower wire width to the wire segment;

(d) testing the wire segment with the assigned narrower wire width with an electromigration checker;

(e) repeating steps (c) and (d) if the wire segment with the assigned narrower wire width passes the electromigration check; and (f) finally assigning a narrowest width to the wire segment which passed the electromigration checker.

10. A method for tapering a circuit segment of an IC circuit, comprising the steps of:

(a) determining a total capacitive load existing downstream from the circuit segment; and (b) assigning an available narrower width to the circuit segment;

(c) testing whether the circuit segment is wide enough to sustain the total capacitive load;

(d) repeating steps (b) and (c) until step (c) indicates that the circuit segment is not wide enough to sustain the total capacitive load; and (e) assigning a wire width to the circuit segment which last tested as wide enough to sustain the capacitive load.

11. The method according to claim 10, wherein the total capacitive load includes loads contributed by downstream vias, sink pins, and wire segments, if any.

12. The method according to claim 3, further comprising the steps of:

(g) locating a next wire segment not previously located and that satisfies the following criteria:

i) the next wire segment terminates on a sink point, and ii) if there are no other unlocated wire segments terminating on a sink point, the next wire segment is not further from a sink point than any other unlocated wire segment according to a number of wire segments between the next wire segment and any sink point in the preliminary circuit design;

(h) assigning an available narrower wire width to the next wire segment;

(i) testing the next wire segment with the assigned narrower wire width with the electromigration checker;

(j) repeating steps (h) and (i) if the next wire segment with the assigned narrower wire width passes the electromigration check;

(k) finally assigning a narrowest width to the next wire segment which passed the electromigration checker including storing narrowest width data in a circuit library.

13. The method according to claim 12, wherein the step (g) further includes the following criterion:

iii) the next wiring segment is a widest wiring segment of wiring segments that satisfy i) and ii).

14. The method of claim 4, wherein the step (g) further includes the step of:

optimizing a circuit timing of the IC wiring design including determining a length of the portion according to a delay formula representing a timing of the wire segment.

15. The method of claim 8 wherein the step (c) includes selecting a net from the netlist having a widest assigned wiring segment width.

16. A program storage device readable by machine, tangibly embodying a program of instructions executable by the machine to perform method steps for narrowing assigned wire segment widths satisfying electromigration criteria, said method steps comprising:

a) selecting a net from a circuit database, the net comprising a plurality of wire segments;

b) selecting a single wire segment from the net, the wire segment having an assigned wire width;

c) assigning a narrower wire width to the wire segment; and d) testing the wire segment with an electromigration checker according to its narrower wire width.

17. The method according to claim 16, wherein the step c) includes the step of assigning the narrower wire width to a precalculated portion of the wire segment.

* * * * *